United States Patent
Pelella

(10) Patent No.: US 7,102,946 B2
(45) Date of Patent: Sep. 5, 2006

(54) LOCAL BIT SELECT CIRCUIT WITH SLOW READ RECOVERY SCHEME

(75) Inventor: Antonio R. Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/054,148

(22) Filed: Feb. 9, 2005

(65) Prior Publication Data

US 2006/0176728 A1    Aug. 10, 2006

(51) Int. Cl.
*G11C 7/00* (2006.01)
*G11C 7/02* (2006.01)

(52) U.S. Cl. .................. 365/205; 365/154; 365/156; 365/190; 365/208

(58) Field of Classification Search ............... None
See application file for complete search history.

(56) References Cited

U.S. PATENT DOCUMENTS

| | | | | |
|---|---|---|---|---|
| 4,400,800 A | * | 8/1983 | Kurafuji | 365/190 |
| 5,719,811 A | * | 2/1998 | Kondou | 365/189.06 |
| 6,275,433 B1 | * | 8/2001 | Forbes | 365/205 |

* cited by examiner

*Primary Examiner*—Son Mai
(74) *Attorney, Agent, or Firm*—Lynn L. Augspurger; Laurence J. Marhoefer

(57) ABSTRACT

Local bit line pairs in a domino SRAM include an amplifier to amplify the voltage differential across the bit lines during a read operation if a cell in the local group of cells has been identified as a slow to read cell. The amplifier includes a transistor switch that is turned on by a timing pulse during the read operation, but only if the Array Built In Self-Test (ABIST) has detected a slow to read cell in the local group. If there is no slow cell, the amplifier is not activated, and the domino read operation is carried out. The amplifier can be used globally across the SRAM or selectively in certain sub-arrays.

20 Claims, 3 Drawing Sheets

LOCAL BIT SELECT CIRCUIT WITH SLOW READ RECOVERY SCHEME

CROSS-REFERENCE TO RELATED APPLICTIONS

This application contains subject matter that is related to the subject matter of the following co-pending applications, each of which is assigned to the assignee of this application, International Business Machines Corporation of Armonk, N.Y. Each of the below listed applications is hereby incorporated herein by reference in its entirety. High Speed Domino Bit Line Interface Early Read and Noise Suppression, Ser. No. 11/054,296; Global Bit Select Circuit With Dual Read and Write Bit Line Pairs, Ser. No. 11/054,309; Global Bit Line Restore Timing Scheme and Circuit; Ser. No. 11/054,479; Local Bit Select With Suppression of Fast Read Before Write, Ser. No. 11/054,402.

BACKGROUND OF THE INVENTION

1. Field of the Invention

This invention relates to a high performance domino STATIC RANDOM ACCESS MEMORY (SRAM) in which the core memory cells are organized into sub-arrays accessed by local bit lines connected to global bit lines, and more particularly to an improved domino SPAM with a local sense amplifier to boost the local bit line voltage during a read operation for cell that has been identified as a slow read cell.

2. Description of Background

A static semiconductor memory typically includes six-transistor cell in which four transistors are configured as a cross-coupled latch for storing data. The remaining two transistors are used to obtain access to the memory cell. During a read access, differential data stored in the memory cell is transferred to the attached bit line pair. A sense amplifier senses the differential voltage that develops across the bit line pair. During a write access, data is written into the memory cell through the differential bit line pair. Typically, one side of the bit line pair is driven to a logic low level potential and the other side if driven to a high voltage level. The cells are arranged in an array that has a grid formed of bit lines and word lines, with the memory cells disposed at intersections of the bit lines and the word lines. The bit lines and the word lines are selectively asserted or negated to enable at least one cell to be read or written to.

As will be appreciated by those skilled in the art, in prior art domino SRAM design the cells are arranged into groups of cells, typically on the order of eight to sixteen cells per group. Each cell in a group is connected to a local bit line pair. The local bit line pair for each group of cells is coupled to a global bit line pair. Rather than use sense amplifier to detect a differential voltage when reading a cell, in a domino SRAM the local bit lines are precharged and discharged by the cell in a read operation, which discharge is detected and determines the state of the cell. The local bit line, the precharge means, and the detection means define a dynamic node of the domino SRAM. Domino SRAMs of the type discussed here are explained in greater detail in U.S. Pat. Nos. 5,729,501, 6,058,065 and 6,657,886, which are incorporated herein by reference.

In a domino SRAM cell, in the read operation the cell must produce a bit line voltage large enough to drive off the SRAM macro with no help from a sense amplifier. This presents a problem because an SRAM typically includes at least a few cells that are "fast to write" but "slow to read".

The problem can occur within the normal process window were the pass gate on one side of the cell is relatively strong (the fast write side) and the pass gate on the other side is relatively weak (the slow read side). The "fast write slow read" cell is not a problem in traditional SRAM designs using a state of the art sense amplifier because if a cell produces 300 mv or 30 mv, the sense amplifier can amplify relatively small bit line voltages. The prior art approach to the problem of a slow read domino SRAM cell is to either swapping in spare bit line columns, or swapping in spare word line rows, or waiting longer for the slow cell to produce the proper voltage needed to drive the SRAM macro. These prior art approaches all result in some form of performance slow down, either fixed or variable.

SUMMARY OF THE INVENTION

An object of this invention is the provision of domino SRAM cell with a circuit that boosts the local bit line voltage during a read operation if a slow cell has been identified in the local array.

Briefly, this invention contemplates the provision of a domino SRAM in which local bit line pairs include an amplifier to amplify the voltage differential across the bit lines during a read operation if a cell in the local group of cells has been identified as a slow to read cell. The amplifier includes a transistor switch that is turned on by a timing pulse during the read operation, but only if the Array Built In Self-Test (ABIST) has detected a slow to read cell in the local group. If there is no slow cell, the amplifier is not activated, and the domino read operation is carried out. The amplifier can be used globally across the SRAM or selectively in certain sub-arrays.

BRIEF DESCRIPTION OF THE DRAWINGS

The subject matter, which is regarded as the invention, is particularly pointed out and distinctly claimed in the claims at the conclusion of the specification. The forgoing and other objects, features, and advantages of the invention are apparent from the following detailed description taken in conjunction with the drawings in which:

DETAILED DESCRIPTION OF THE INVENTION

Figure 1:
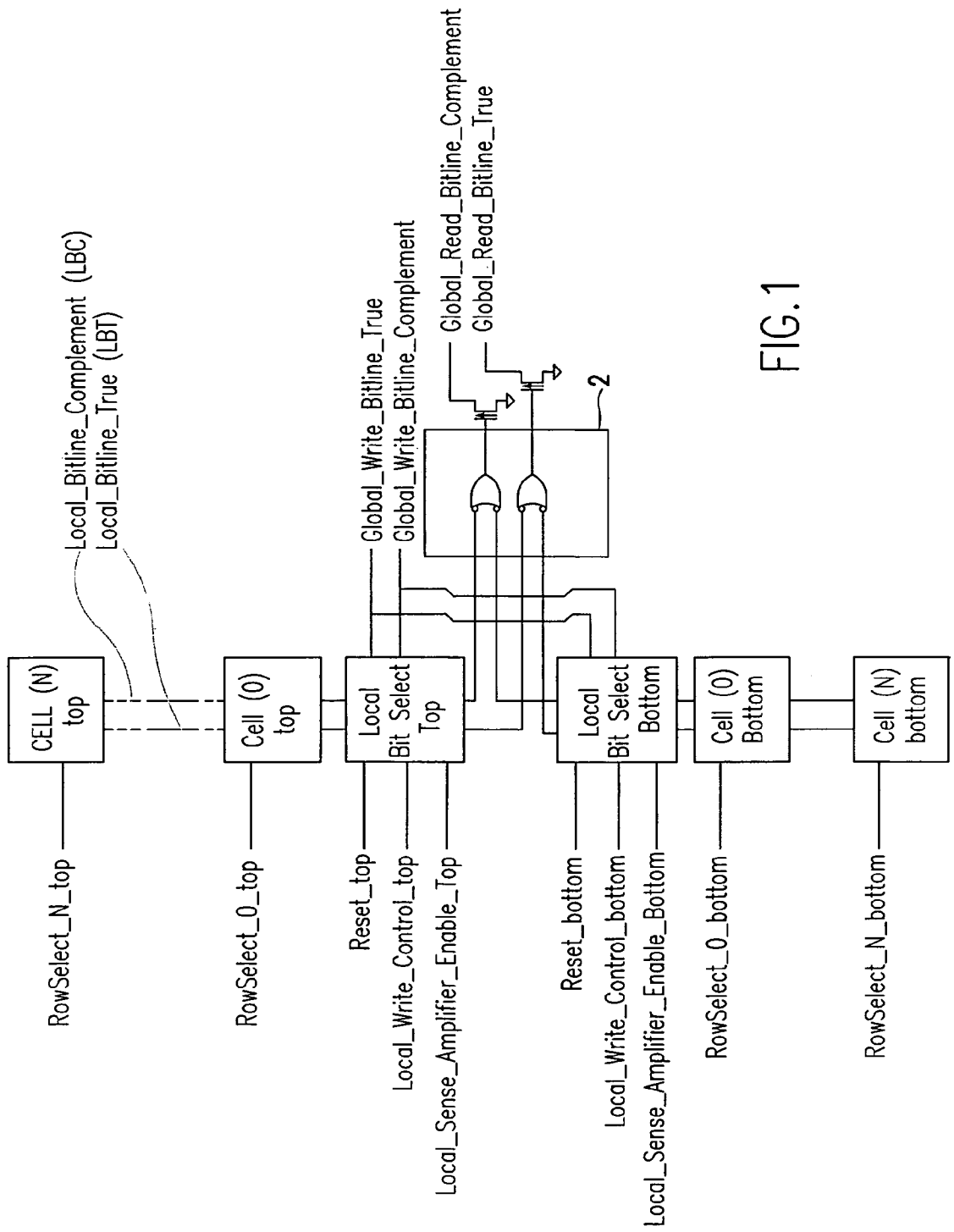
FIG. 1 is a partially block diagram and partially schematic diagram of sub array of N cells served by a local bit select in accordance with the teachings of this invention.

Referring to FIG. 1, it shows one SRAM "subarray" accessed by one local bit select. This sub-array has 0 through N cells labeled "top" and 0 through N cells labeled "bottom" with the top and bottom cells mirrored around an "OR" function 2, with half the cells on one side and half on the other. Furthermore, both the upper and lower "local bit line pairs" are "OR'ed" together to drive the "wired OR" NFETs that are connected to the global Read Bit line pairs. The Write Global Bit line pairs connect directly to each "local bit select" circuits. Arranging the cells around a central point, reduces the RC delay on the "local bit lines" because the distance to the furthest cell has been reduced, resulting in greater read and write performance.

Figure 2:
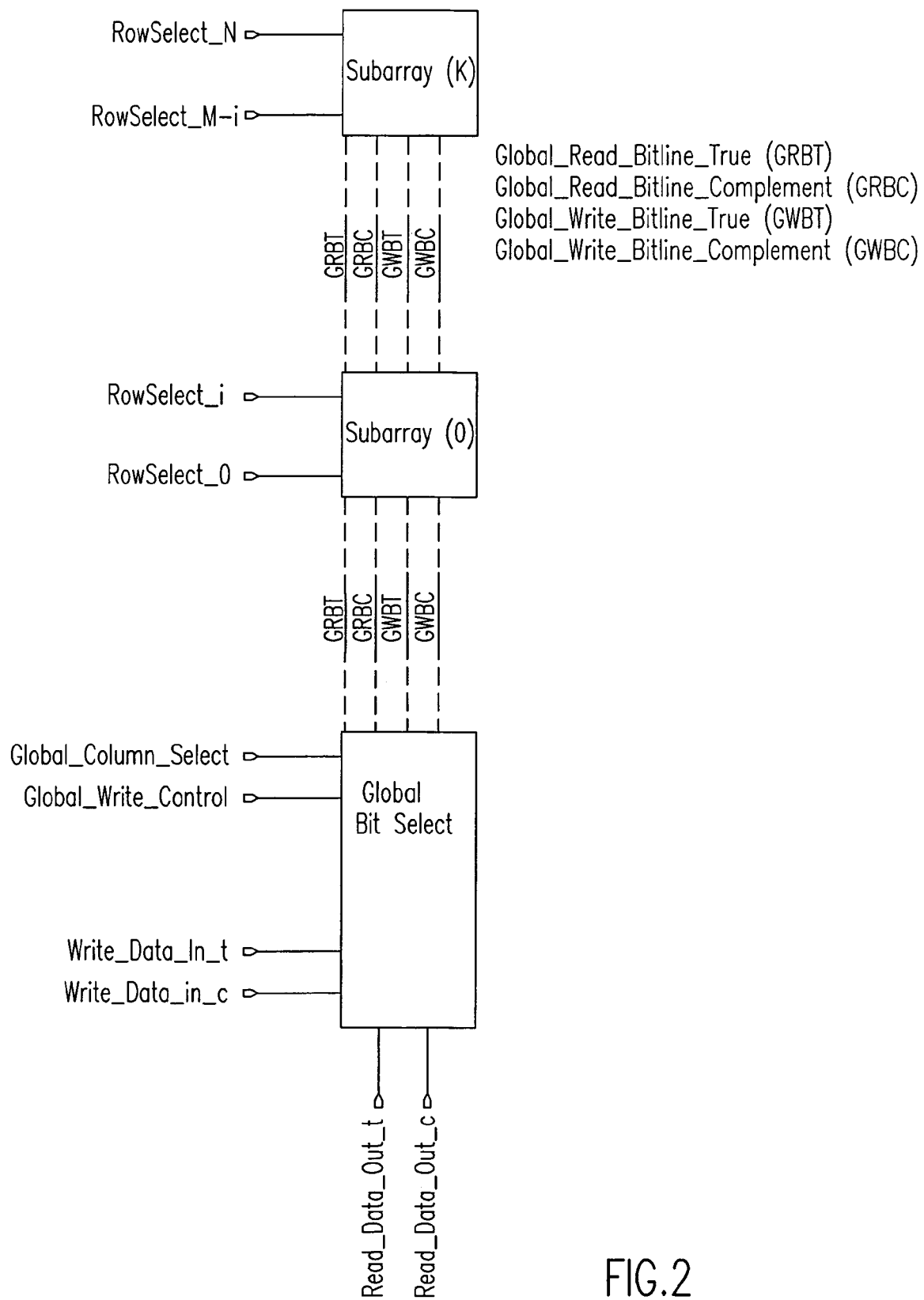
FIG. 2 is a block diagram of a one bit×M bits array in accordance with the teachings of this invention.

FIG. 2 is a one bit by M bit array of a domino SRAM where K sub-arrays (each containing i cells along the local bit lines) are connected to one global bit select circuit.

Figure 3:
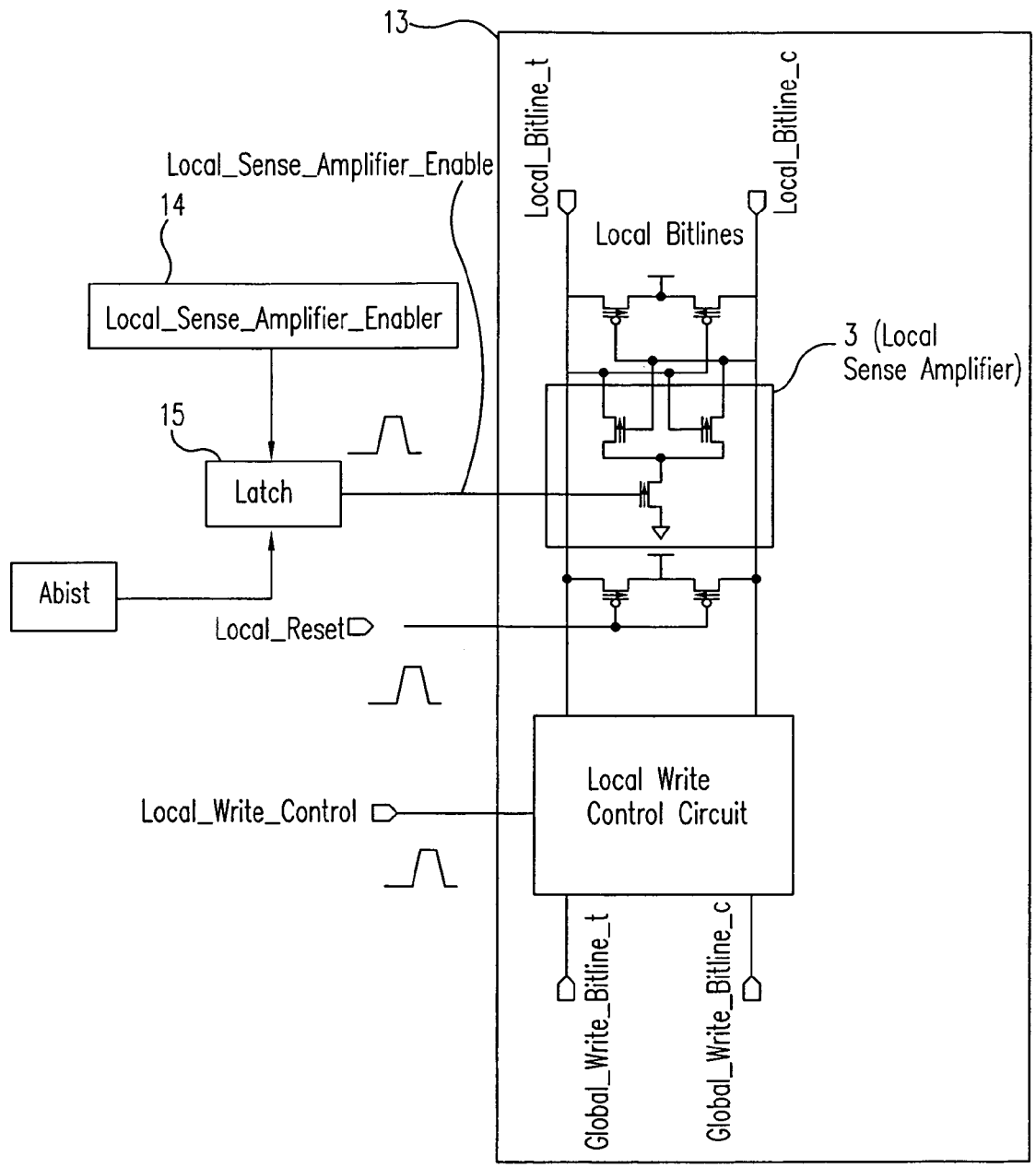
FIG. 3 is a schematic diagram of the amplifier in accordance with the teachings of this invention.

Referring now to FIG. 3, a local bit select circuit, incorporating a read sense amplifier, to recover slow reading cells is shown. The local amplifier (3) is comprised of three NFET transistors N1, N2, and N0. The drain of N1 is coupled to one side of the local bit line pair, here Local_Bitline_c and the drain of N2 is coupled to the other side of the local bit line pair, Local_Bitline t. The gates of N1 and N2 are cross coupled, with the gate of N1 coupled to Local_Bitline t and the gate of N2 coupled to Local_Bitline c. The sources of N1 and N2 are coupled to a common node via the NFET transistor switch N0, which controls whether or not the local sense amplifier is employed or not employed. As in prior SRAM, including domino SRAM, the SRAM array includes Array Built In Self-Test (ABIST) hardware, which is used to test the production SRAM. If the ABIST detects one or more slow to read cells in a local array, a latch 15 is set to couple the gate of transistor N0 to a "read enable pulse" source 14, which turns on the amplifier for the duration of the read enable pulse. This read enable pulse is timed in such a way so as to ensure a large enough voltage differential is present between the Local_Bitline_c and Local_Bitline t resulting in a proper sensing operation. If the ABIST does not detect a "slow to read" cell, the latch is not set, and the gate of N0 is not coupled to the read enable pulses. In this case, the amplifier (3) is electrically dormant, allowing normal domino read operation. PFET P0 and P1 are traditional cross coupled pfets used to prevent the unselected side from "drooping" down due to noise or leakage. The reset devices, PFET P3 and P4, reset the local bit lines in response to the local reset pulse.

The invention claimed is:

1. A domino SRAM comprising in combination:
   a local bit line amplifier connected across a local bit line pair;
   a transistor switch coupled to said amplifier, said switch in one state rendering said amplifier operative to amplify a voltage difference between said local bit line pair and in another state rendering said amplifier dormant;
   means to place said switch in said one state during a read operation if a cell serviced by said local bit line pair has been determined to be a slow to read cell.

2. A method for operating a domino SRAM including the steps of:
   detecting a slow to read cell in an SRAM array serviced by a local bit line pair;
   amplifying the voltage between said local bit line pair during a read operation in response to said detecting step.

3. A domino SRAM as in claim 1 wherein said local bit line amplifier includes a pair of field effect transistors cross-coupled between said local bit line pair.

4. A domino SRAM as in claim 3 wherein said transistor switch is a field effect transistor.

5. A domino SRAM as in claim 4 wherein said pair of field effect transistors and said transistor switch are N-type field effect transistors.

6. A domino SRAM as in claim 1 wherein said means includes a latch responsive to an array built in self-test generated signal.

7. A domino SRAM as in claim 3 wherein said means includes a latch responsive to an array built in self-test generated signal.

8. A domino SRAM as in claim 4 wherein said means includes a latch responsive to an array built in self-test generated signal.

9. A method as in claim 2 wherein said amplifying step is carried out only in response to said detecting step.

10. A method as in claim 2 wherein said detecting step includes the step of a built in self-test of said SRAM.

11. A method as in claim 9 wherein said detecting step includes the step of a built in self-test of said SRAM.

12. A method as in claim 10 wherein including the step of setting a latch when said built in self-test detects a slow to read cell.

13. A method as in claim 11 including the step of setting a latch when said built in self-test detects a slow to read cell.

14. A domino SRAM system comprising in combination:
   means to amplify a voltage difference across a local bit line pair;
   means to detect a slow to read cell in an SRAM array serviced by said local bit line pair;
   means to enable said means to amplify in response to detection of a slow to read cell.

15. A domino SRAM system as in claim 14 further including means to disable said means to amplify.

16. A domino SRAM system as in claim 14 wherein said means to detect includes built in self-test means.

17. A domino SRAM system as in claim 15 wherein said means to detect includes built in self-test means.

18. A domino SRAM system as in claim 15 wherein said means to enable and said means to disable includes a latch.

19. A domino SRAM system as in claim 15 wherein said means to enable and said means to disable includes a latch set by said built in self-test means.

20. A domino SRAM system as in claim 17 wherein said means to enable and said means to disable includes a latch set by said built in self-test means.

* * * * *